(12) United States Patent
Lee et al.

(10) Patent No.: US 11,177,457 B2
(45) Date of Patent: Nov. 16, 2021

(54) DISPLAY APPARATUS

(71) Applicant: Au Optronics Corporation, Hsinchu (TW)

(72) Inventors: Chih-Tsung Lee, Hsinchu (TW); Zih-Shuo Huang, Hsinchu (TW); Yi-Wei Tsai, Hsinchu (TW); Ko-Chin Chung, Hsinchu (TW); Ming-Chang Hsu, Hsinchu (TW); Heng-Chia Hsu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 262 days.

(21) Appl. No.: 16/592,792

(22) Filed: Oct. 4, 2019

(65) Prior Publication Data
US 2020/0235334 A1 Jul. 23, 2020

Related U.S. Application Data

(60) Provisional application No. 62/794,042, filed on Jan. 18, 2019.

(30) Foreign Application Priority Data

Jun. 14, 2019 (TW) .................................. 108120649

(51) Int. Cl.
*H01L 51/52* (2006.01)
*H01L 51/00* (2006.01)
*H01L 27/32* (2006.01)

(52) U.S. Cl.
CPC ...... *H01L 51/5253* (2013.01); *H01L 51/0097* (2013.01); *H01L 27/3244* (2013.01); *H01L 2251/5338* (2013.01)

(58) Field of Classification Search
CPC ......... H01L 2251/5338; H01L 27/3244; H01L 51/0097; H01L 51/5237; H01L 51/5253; Y02E 10/549
(Continued)

(56) References Cited

U.S. PATENT DOCUMENTS 7,119,285 B2 10/2006 Kim et al.
8,445,529 B2 5/2013 Kawashima et al.
(Continued)

FOREIGN PATENT DOCUMENTS

CN 104347000 2/2015
CN 105789242 7/2016
(Continued)

*Primary Examiner* — Long K Tran
(74) *Attorney, Agent, or Firm* — JCIPRNET (57) ABSTRACT

A display apparatus includes a substrate, an element layer, a protective film, a mechanical member, a first adhesive layer and a second adhesive layer. An opening of the protective film is located between a first portion of the protective film and a second portion of the protective film. The first portion of the protective film, the second portion of the protective film and the opening of the protective film are respectively overlapped with a first portion of the substrate, a second portion of the substrate and a third portion of the substrate. The first adhesive layer and the second adhesive layer are respectively disposed on a first surface and a second surface of the mechanical member. The third portion of the substrate is connected between the first portion of the substrate and the second portion of the substrate, and the third portion of the substrate is bent.

10 Claims, 8 Drawing Sheets

(58) Field of Classification Search
USPC .............................................................. 257/4
See application file for complete search history.

(56) References Cited

U.S. PATENT DOCUMENTS

| | | |
|---|---|---|
| 9,354,476 B2 | 5/2016 | Han et al. |
| 2005/0122700 A1 | 6/2005 | Kim et al. |
| 2011/0124668 A1 | 5/2011 | Kawashima et al. |
| 2015/0043174 A1 | 2/2015 | Han et al. |
| 2016/0218305 A1 | 7/2016 | Kim et al. |
| 2016/0374193 A1* | 12/2016 | Namkung ............. G02F 1/1333 |

FOREIGN PATENT DOCUMENTS

| | | |
|---|---|---|
| CN | 105826350 | 8/2016 |
| CN | 106601133 | 4/2017 |
| JP | 2010043070 | 2/2010 |
| TW | I291313 | 12/2007 |

* cited by examiner

| Removal rate (%) | Resilience force (MPa) | Descend range of resilience force (%) | Tensile stress of second element layer (MPa) | Pressure stress of first element layer (MPa) |
|---|---|---|---|---|
| 0 | 61.1 | — | 201.9 | −219.4 |
| 20 | 71.7 | −17.3 | 190.4 | −248.8 |
| 50 | 22.0 | 64.0 | 141.6 | −299.3 |
| 70 | −2.9 | 104.7 | 113.2 | −353.3 |
| 90 | 7.8 | 87.2 | 65.1 | −295.2 |
| 100 | 15.3 | 75.0 | 51.7 | N/A |

DISPLAY APPARATUS

CROSS-REFERENCE TO RELATED APPLICATION

This application claims the priority benefits of U.S. provisional application Ser. No. 62/794,042, filed on Jan. 18, 2019, and Taiwan application serial no. 108120649, filed on Jun. 14, 2019. The entirety of each of the above-mentioned patent applications is hereby incorporated by reference herein and made a part of this specification.

BACKGROUND OF THE DISCLOSURE

1. Field of the Disclosure

The present disclosure generally relates to an electronic apparatus, and in particular, to a display apparatus.

2. Description of Related Art

With the development of display technologies, the application range of display panels is increasingly wide. For example, in the early days, display panels are mostly used as screens of electronic apparatuses (e.g., televisions, computers, mobile phones, etc.), while most of the display panels applied to electronic apparatuses are hard display panels. Recently, some people have applied the display panels to wearable apparatuses (e.g., watches, clothes, etc.), and most of the display panels applied to the wearable apparatuses are flexible display panels.

Two regions of the flexible display panel may be respectively fixed to two opposite surfaces of a mechanical member by a plurality of adhesive layers, so as to maintain a bent state. However, a substrate of the bent flexible display panel has a resilience force, so that the original flexible display panel that has been fixed to the mechanical member is easily separated from the mechanical member.

SUMMARY OF THE DISCLOSURE

The present disclosure provides a display apparatus, a flexible display panel of which is not easily separated from a mechanical member.

The display apparatus of the present disclosure includes a substrate, an element layer, a protective film, a mechanical member, a first adhesive layer and a second adhesive layer. The substrate has a first portion, a second portion, and a third portion. The element layer is arranged on a first side of the substrate. The protective film is arranged on a second side of the substrate, and has a first portion, a second portion, and an opening. The opening of the protective film is located between the first portion of the protective film and the second portion of the protective film. The first portion of the protective film, the second portion of the protective film, and the opening of the protective film are respectively overlapped with the first portion of the substrate, the second portion of the substrate, and the third portion of the substrate. The mechanical member is arranged on the second side of the substrate, and has a first surface and a second surface which are opposite. The first adhesive layer is arranged on the first surface of the mechanical member. The second adhesive layer is arranged on the second surface of the mechanical member. The first portion of the protective film is arranged on the first adhesive layer. The second portion of the protective film is arranged on the second adhesive layer. The third portion of the substrate is connected between the first portion of the substrate and the second portion of the substrate and is bent. The third portion of the substrate has a first mesa sub-portion and a manufacture sub-portion. The first mesa sub-portion extends from the first portion of the substrate to the outside of the first adhesive layer. The manufacture sub-portion is a recess recessed towards the element layer or a through hole of the third portion of the substrate.

In order to make the aforementioned and other objectives and advantages of the present disclosure comprehensible, embodiments accompanied with figures are described in detail below.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

In the accompanying drawings, the thicknesses of layers, films, panels, regions, and the like are enlarged for clarity. Throughout the specification, same reference numerals indicate same components. It should be understood that when a component such as a layer, film, region or substrate is referred to as being "on" or "connected" to another component, it may be directly on or connected to the another component, or intervening components may also be present. In contrast, when a component is referred to as being "directly on" or "directly connected to" another component, there are no intervening assemblies present. As used herein, "connection" may refer to a physical and/or electrical connection.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

Unless otherwise defined, all terms (including technical and scientific terms) used herein have the same meaning as commonly understood by one of ordinary skill in the art to which the present disclosure belongs. It will be further understood that terms such as those defined in commonly used dictionaries should be interpreted as having a meaning that is consistent with their meaning in the context of the relevant art and the present disclosure and will not be interpreted in an idealized or overly formal sense unless expressly so defined herein.

Figure 1:
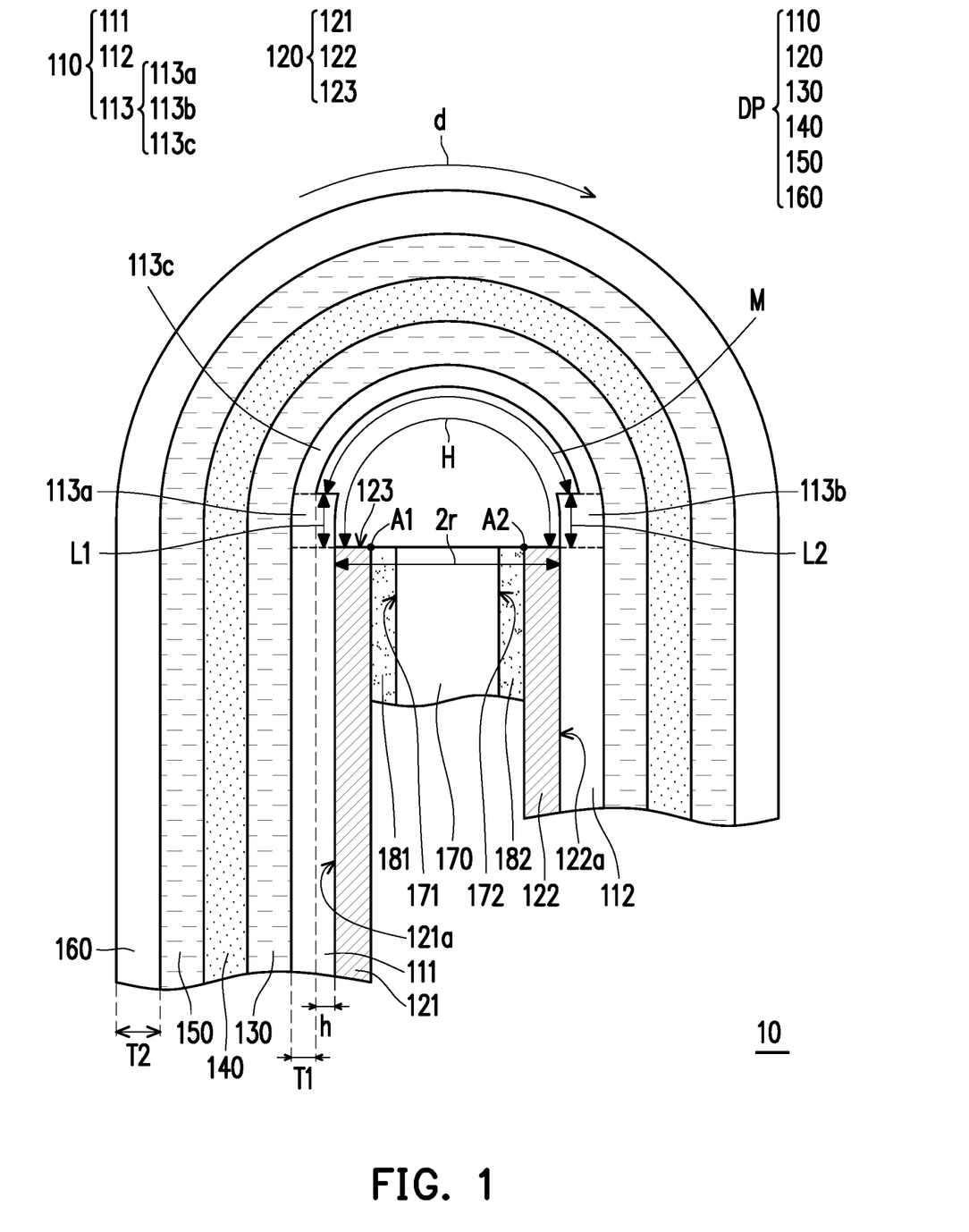
FIG. 1 is a cross-sectional schematic diagram of a display apparatus 10 according to one embodiment of the present disclosure.

FIG. 1 is a cross-sectional schematic diagram of a display apparatus 10 according to one embodiment of the present disclosure.

Figure 2:
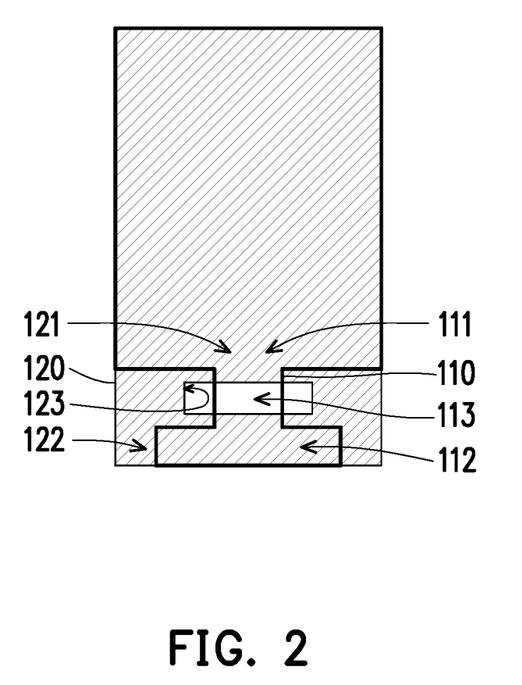
FIG. 2 is a top view of a first substrate 110 and a protective film 120 which are unfolded according to one embodiment of the present disclosure.

FIG. 2 is a top view of a first substrate 110 and a protective film 120 which are unfolded according to one embodiment of the present disclosure.

Referring to FIG. 1 and FIG. 2, the display apparatus 10 includes a first substrate 110. The first substrate 110 has a first portion 111, a second portion 112 and a third portion 113. The third portion 113 is connected between the first portion 111 and the second portion 112, and the third portion 113 is used for being bent.

The first substrate 110 is a flexible substrate. For example, in the present embodiment, the material of the first substrate 110 may be selected from organic polymers, such as: polyimide (PI), polyethylene naphthalate (PEN), polyethylene terephthalate (PET), polycarbonates (PC), polyether sulfone (PES), polyarylate or other suitable materials. However, the present disclosure is not limited thereto. The material of the first substrate 110 may also be selected from inorganic materials according to other embodiments.

The display apparatus 10 also includes a first element layer 130, formed on the first substrate 110. The first element layer 130 is arranged on a first side (namely an outer side) of the first substrate 110.

For example, in the present embodiment, the first element layer 130 may include a buffer layer (not shown), a thin film transistor (not shown), a peripheral wire (not shown), a connection pad (not shown), a flat layer (not shown), a pixel electrode (not shown), a pixel definition layer (not shown), an organic electroluminescent material (not shown), and a common electrode (not shown). The buffer layer is arranged on the first portion 111, the second portion 112 and the third portion 113 of the first substrate 110. The thin film transistor is arranged on the buffer layer and located in the first portion 111. The connection pad is arranged on the buffer layer and located in the second portion 112. The peripheral wire is located in the third portion 113 and electrically connected between the thin film transistor and the connection pad. The flat layer is arranged on the thin film transistor, the peripheral wire and the connection pad. The pixel electrode is arranged on the flat layer and electrically connected to the thin film transistor. The pixel definition layer is arranged on the pixel electrode and the flat layer and has a pixel opening overlapped with the pixel electrode. The organic electroluminescent material is arranged on the pixel opening. The common electrode is arranged on the organic electroluminescent material. However, the present disclosure is not limited thereto. The first element layer 130 may also be of other forms according to other embodiments.

In an embodiment of FIG. 2, the third portion 113, used for being bent, of the first substrate 110 is a region configured to arrange the peripheral wire. However, the present disclosure is not limited thereto. According to other embodiments, the third portion 113, used for being bent, of the first substrate 110 may also be a display region for arranging a pixel electrode and/or other regions, needing to be bent, of the display apparatus 10.

The display apparatus 10 also includes a protective film 120, which may be adhered on the first substrate 110. The protective film 120 is arranged on a second side (namely an inner side) of the first substrate 110. The protective film 120 has a first portion 121, a second portion 122 and an opening 123. The opening 123 of the protective film 120 is located between the first portion 121 of the protective film 120 and the second portion 122 of the protective film 120. The first portion 121 of the protective film 120 and the second portion 122 of the protective film 120 are respectively overlapped with the first portion 111 of the first substrate 110 and the second portion 112 of the first substrate 110. The opening 123 of the protective film 120 is overlapped with the third portion 113 of the first substrate 110. That is, the third portion 113 of the first substrate 110 refers to a region, which is not covered by the entities (i.e., the first portion 121 and the second portion 122) of the protective film 120, of the first substrate 110.

The display apparatus 10 also includes a mechanical member 170. The mechanical member 170 is arranged on the second side of the first substrate 110, namely the inner side of the first substrate 110. The mechanical member 170 has a first surface 171 and a second surface 172 which are opposite. The mechanical member 170 is a piece of hardware. For example, in the present embodiment, the mechanical member 170 may be a slider, but the present disclosure is not limited thereto.

The display apparatus 10 also includes a first adhesive layer 181 and a second adhesive layer 182. The first adhesive layer 181 and the second adhesive layer 182 are respectively arranged on the first surface 171 of the mechanical member 170 and the second surface 172 of the mechanical member 170. The first portion 121 of the protective film 120 is arranged on the first adhesive layer 181. The first portion 121 of the protective film 120 is fixed to the first surface 171 of the mechanical member 170 by the first adhesive layer 181. The second portion 122 of the protective film 120 is arranged on the second adhesive layer 182. The second portion 122 of the protective film 120 is fixed to the second surface 172 of the mechanical member 170 by the second adhesive layer 182. The third portion 113 of the first substrate 110 is connected between the first portion 111 of the first substrate 110 and the second portion 112 of the first substrate 110 and is bent.

It is worth mentioning that the bent third portion 113 of the first substrate 110 has a first mesa sub-portion 113a and a manufacture sub-portion 113c. The first mesa sub-portion 113a extends from the first portion 111 of the first substrate 110 to the outside of the first adhesive layer 181. In the present embodiment, the thickness T1 of the first mesa sub-portion 113a and the thickness T1 of the first portion 111 of the first substrate 110 may be substantially equal, but the present disclosure is not limited thereto. In the present embodiment, the manufacture sub-portion 113c may be a recess recessed towards the first element layer 130, but the present disclosure is not limited thereto.

By arranging the manufacture sub-portion 113c on the bent section (namely the third portion 113) of the first substrate 110, the resilience force of the first substrate 110 may be reduced. More importantly, a point A1 is located at an intersection of the first portion 121 of the protective film 120 and the first adhesive layer 181 and an edge of the first adhesive layer 181, so that the resilience force, acting on the point A1, of the first substrate 110 may be greatly reduced, and even substantially reduced to zero, through the first mesa sub-portion 113a extending to the outside of the first adhesive layer 181. Therefore, the problem that the protective film 120 is easily separated from the mechanical member 170 may be greatly relieved.

In the present embodiment, the bent third portion 113 of the first substrate 110 further has a second mesa sub-portion 113b. The manufacture sub-portion 113c is arranged between the first mesa sub-portion 113a and the second mesa sub-portion 113b. The second mesa sub-portion 113b extends from the second portion 112 of the first substrate 110 to the outside of the second adhesive layer 182. In the present embodiment, the thickness T1 of the second mesa sub-portion 113b and the thickness T1 of the second portion 112 of the first substrate 110 may be substantially equal, but the present disclosure is not limited thereto.

A point A2 is located at an intersection of the second portion 122 of the protective film 120 and the second adhesive layer 182 and an edge of the second adhesive layer 182, so that the resilience force, acting on the point A2, of the first substrate 110 may be greatly reduced, and even substantially reduced to zero, through the second mesa sub-portion 113b extending to the outside of the second adhesive layer 182. Therefore, the problem that the protective film 120 is easily separated from the mechanical member 170 may be greatly relieved.

In the present embodiment, the display apparatus 10 also may selectively include a middle layer 140, a second element layer 150 and a second substrate 160. The second element layer 150 is formed on the second substrate 160. The second element layer 150 is fixed to the first element layer 130 through the middle layer 140 (such as but not limited to: a glue layer). The protective film 120, the first substrate 110, the first element layer 130, the middle layer 140, the second element layer 150 and the second substrate 160 are stacked in sequence. For example, in the present embodiment, the second element layer 150 may include a color filter layer (not shown) and a touch layer (not shown). However, the present disclosure is not limited thereto. The second element layer 150 may also be of other forms according to other embodiments.

In the present embodiment, the protective film 120, the first substrate 110, the first element layer 130, the middle layer 140, the second element layer 150 and the second substrate 160 form a flexible display panel DP. The manufacture sub-portion 113c is formed on the bent section (i.e., the third portion 113) of the first substrate 110, and the neutral axis of the flexible display panel DP may be redistributed to shorten a distance between the second element layer 150 and the neutral axis of the flexible display panel DP. In this way, the tensile stress on the second element layer 150 is reduced, and the second element layer 150 is not easily broken by bending.

The first portion 111 of the first substrate 110, the third portion 113 of the first substrate 110 and the second portion 112 of the first substrate 110 are arranged in a direction d. The opening 123 of the protective film 120 has a width H in the direction d. The first portion 121 of the protective film 120 has a surface 121a facing the first element layer 130, and the second portion 122 of the protective film 120 has a surface 122a facing the first element layer 130. The surface 121a of the first portion 121 of the protective film 120 is spaced apart from the surface 122a of the second portion 122 of the protective film 120 by a distance 2r. In the present embodiment, the third portion 113 of the first substrate 110, the portion of the first element layer 130 that is overlapped with the third portion 113, the portion of the middle layer 140 that is overlapped with the third portion 113, the portion of the second element layer 150 that is overlapped with the third portion 113, and the portion of the second substrate 160 that is overlapped with the third portion 113 are bent sections of the flexible display panel DP, and r may be a curvature radius of the bent sections of the flexible display panel DP. In the present embodiment, H≥πr.

The first mesa sub-portion 113a has a width L1 in the direction d. The second mesa sub-portion 113b has a width L2 in the direction d. The opening 123 of the protective film 120 has a width H in the direction d. The manufacture sub-portion 113c has a width M in the direction d. M=H−(L1+L2). In the present embodiment, the third portion 113 of the first substrate 110, the portion of the first element layer 130 that is overlapped with the third portion 113, the portion of the middle layer 140 that is overlapped with the third portion 113, the portion of the second element layer 150 that is overlapped with the third portion 113, and the portion of the second substrate 160 that is overlapped with the third portion 113 are bent sections of the flexible display panel DP, and the manufacture sub-portion 113c covers the centers of the bent sections of the display panel DP, and $$\frac{\pi r}{4} \leq M \leq \frac{9\pi r}{10}.$$

Preferably, $$\frac{\pi r}{3} \leq M \leq \frac{2\pi r}{3},$$

but the present disclosure is not limited thereto.

In the present embodiment, the width L1 of the first mesa sub-portion 113a in the direction d may be substantially equal to the width L2 of the second mesa sub-portion 113b in the direction d. However, the present disclosure is not limited thereto. According to other embodiments, the width L1 and the width L2 may be inequal, which will be illustrated below in the subsequent paragraphs and other drawings.

Figure 3:
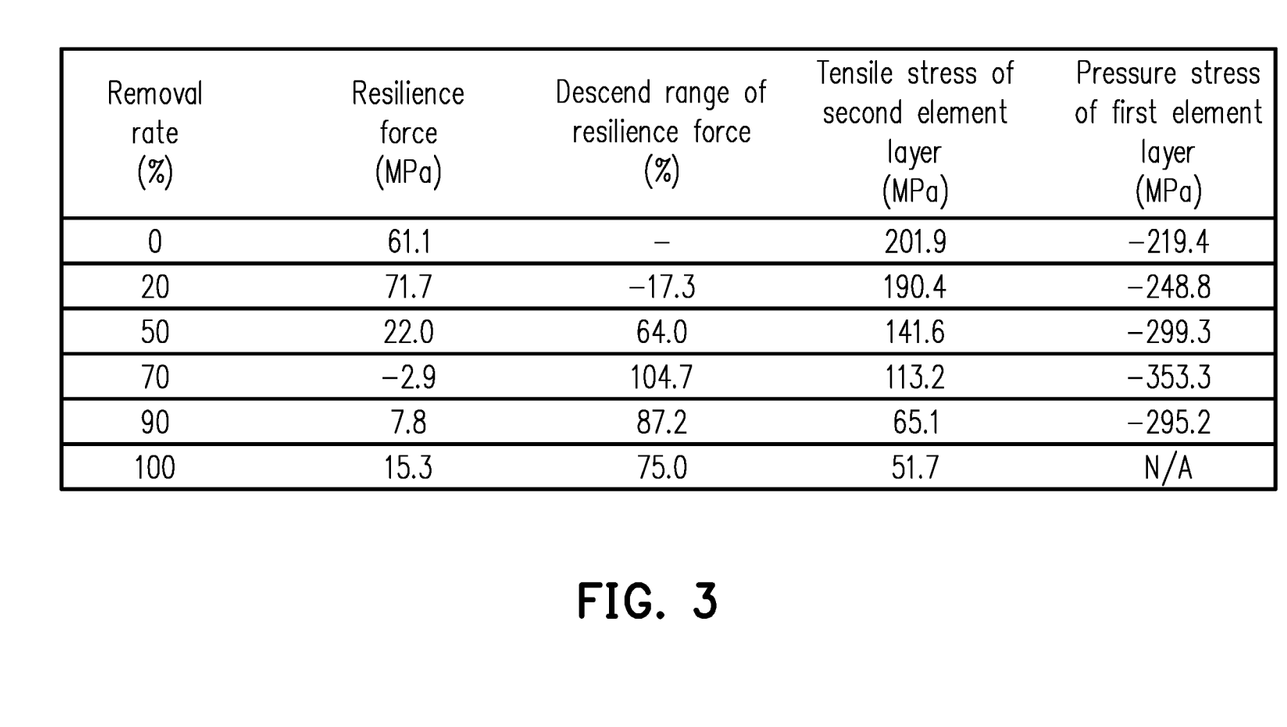
FIG. 3 illustrates a resilience force on a point A1 and/or a point A2, a descend range of the resilience force, a pressure stress on a first element layer 130 and a tensile stress on a second element layer 150 under each removal rate.

The first portion 111 of the first substrate 110 has the thickness T1. The manufacture sub-portion 113c of the first substrate 110 has a depth h, and 0<h≤T1. A ratio h/T1 (%) of the depth h to the thickness T1 is known as a removal rate of the first substrate 110. In the present embodiment, the removal rate of the first substrate 110 may fall within an appropriate range, so as to reduce the resilience force of the first substrate 110 on the point A1 and/or the point A2 and the tensile stress on the second element layer 150. For example, in the present embodiment, $$50\% \leq \frac{h}{T1} \leq 90\%,$$

which is described with reference to FIG. 3.

FIG. 3 illustrates a resilience force on the point A1 and/or the point A2, a descend range of the resilience force, a pressure stress on the first element layer 130 and a tensile stress on the second element layer 150 under each removal rate. Data as shown in FIG. 3 are simulated under the conditions that the Young Modulus of the material of the first substrate 110 is equal to that of the material of the second substrate 160, the thickness T1 of the first portion 111 and the second portion 112 of the first substrate 110 is equal to the thickness T2 of the second substrate 160, r=400 μm, H=πr, M=0.46πr, L1=L2=0.27πr and h=70%. According to simulated results of FIG. 3, it can be seen that when the removal rate falls within the range of 70% to 80%, the resilience force on the point A1 and/or the point A2 has a relatively good descend range.

Referring to FIG. 3, compared with a display apparatus (e.g., a display apparatus having a removal rate of 0 percent) without the manufacture sub-portion 113c, the display apparatus has the advantage that when the removal rate of the first substrate 110 is 50%, the resilience force on the point A1 and/or the point A2 is reduced by 64.0%, and the tensile stress on the second element layer 150 is reduced. Compared with the display apparatus (e.g., the display apparatus having a removal rate of 0 percent) without the manufacture sub-portion 113c, the display apparatus has the advantage that when the removal rate of the first substrate 110 is 70%, the resilience force on the point A1 and/or the point A2 is reduced by 104.7%, and the tensile stress on the second element layer 150 is reduced. That is, when the removal rate is 70%, the resilience force on the point A1 and/or the point A2 may have the largest descend range.

In the present embodiment, under the conditions that the Young Modulus of the material of the first substrate 110 is equal to that of the material of the second substrate 160, and the thickness T1 of the first portion 111 and the second portion 112 of the first substrate 110 is equal to the thickness T2 of the second substrate 160, the optimal removal rate of the first substrate 110 is 70%.

In another embodiment, when the material of the first substrate 110 is changed (i.e., the Young modulus of the material of the first substrate 110 is changed from E1 to E1'), and/or the thickness T1 of the first portion 111 and the second portion 112 of the first substrate 110 is changed (that is, when the thickness of the first portion 111 and the second portion 112 of the first substrate 110 is changed from T1 to T1'), the optimal depth h' of the manufacture sub-portion 113c may be easily calculated by the following formula (1).

$$E1 \times \left(C - \frac{(T1-h)}{2}\right) \times T1 = E1' \times \left(C - \frac{(T1'-h')}{2}\right) \quad (1)$$

where E1 is the Young modulus of the material of the original first substrate 110, E1' is the Young modulus of the material of the changed first substrate 110, C is the position of the neutral axis of the flexible display panel DP, T1 is the thickness of the first portion 111 and the second portion 112 of the original first substrate 110, T1' is the thickness of the first portion 111 and the second portion 112 of the changed first substrate 110, h is the optimal depth of the manufacture sub-portion 113c of the original first substrate 110, and h' is the optimal depth of the manufacture sub-portion 113c of the changed first substrate 110.

For example, the Young modulus of the material of the original first substrate 110 is 7 Gpa, and the thickness T1 of the first portion 111 and the second portion 112 of the original first substrate 110 is 10 μm. When the depth h of the manufacture sub-portion 113c of the original first substrate 110 is equal to 7 μm (that is, when the removal rate is 70%), the largest descend range of the resilience force may be obtained, that is, the optimal depth h of the manufacture sub-portion 113c of the original first substrate 110 is 7 μm. When the Young modulus of the material of the first substrate 110 is changed from 7 GPa to 4 GPa, E1=7 GPa, E1'=4 GPa, C=19.7 μm, T1=T1'=10 μm and h=7 μm are substituted into the above formula (1) to calculate (T1'-h')=5.66 μm and h'=4.34 um. That is, when the Young modulus of the material of the first substrate 110 is changed from 7 GPa to 4 GPa, setting the removal rate of the first substrate 110 to be reduced from the original 70% to 43.4% may obtain the largest descend range of the resilience force.

It should be noted herein that the following embodiments follow the element reference numbers and partial content of the foregoing embodiments, where same reference numbers are used to represent the same or like elements and descriptions of same technical content is omitted. Descriptions of the omitted part may refer to the foregoing embodiments and are not described in the following embodiments again.

Figure 4:
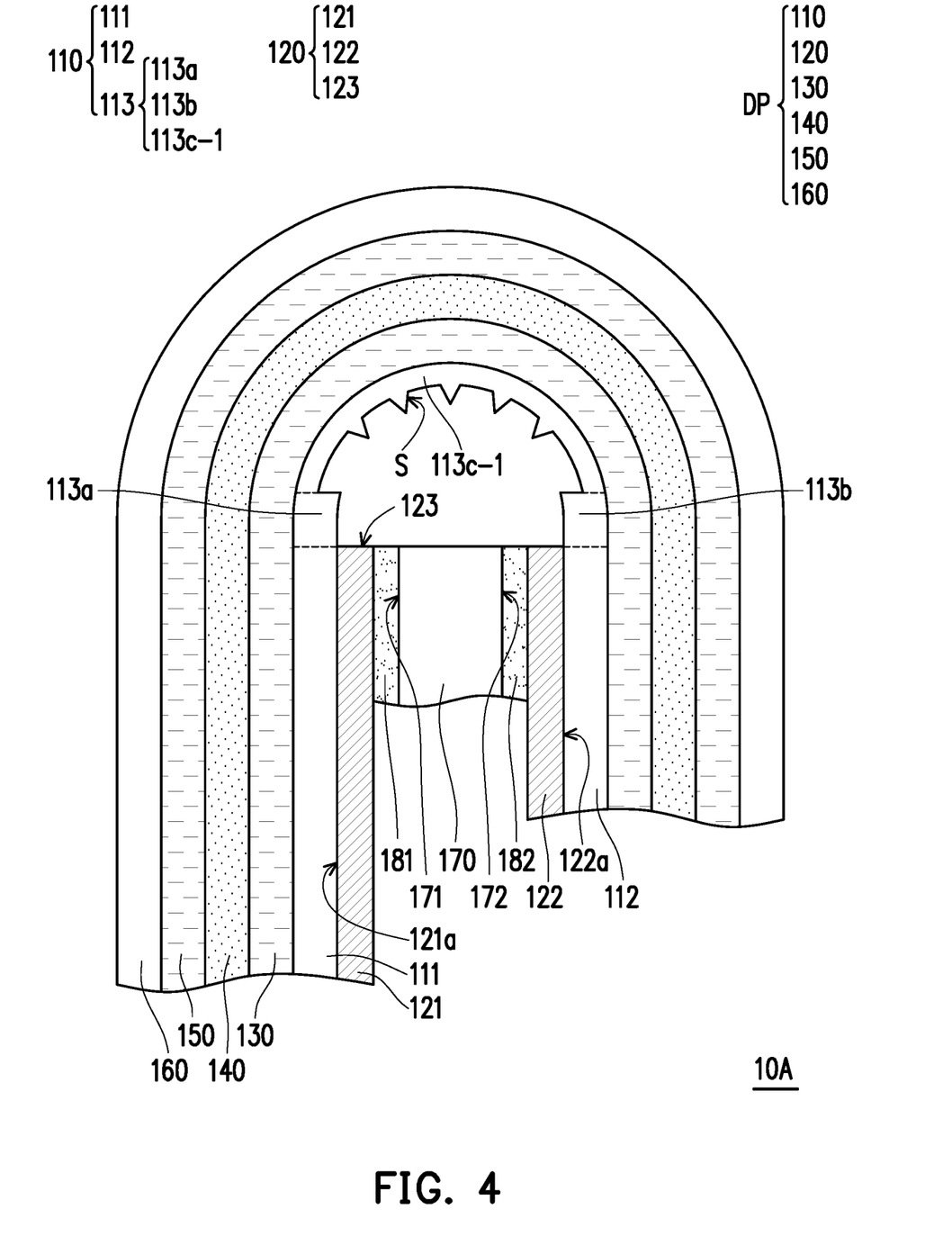
FIG. 4 is a cross-sectional schematic diagram of a display apparatus 10A according to another embodiment of the present disclosure.

FIG. 4 is a cross-sectional schematic diagram of a display apparatus 10A according to another embodiment of the present disclosure. The display apparatus 10A of FIG. 4 is similar to the display apparatus 10 of FIG. 1, but a manufacture sub-portion 113c-1 of FIG. 4 is slightly different from the manufacture sub-portion 113c of FIG. 1.

Referring to FIG. 4, specifically, in the present embodiment, the manufacture sub-portion 113c-1 is also a recess. The difference from the embodiment of FIG. 1 is that a bottom surface S of the manufacture sub-portion 113c-1 is a fluctuant surface. For example, the manufacture sub-portion 113c-1 may be formed by scanning laser. The bottom surface S of the recess formed by scanning laser may be possibly non-flat and slightly fluctuant.

Figure 5:
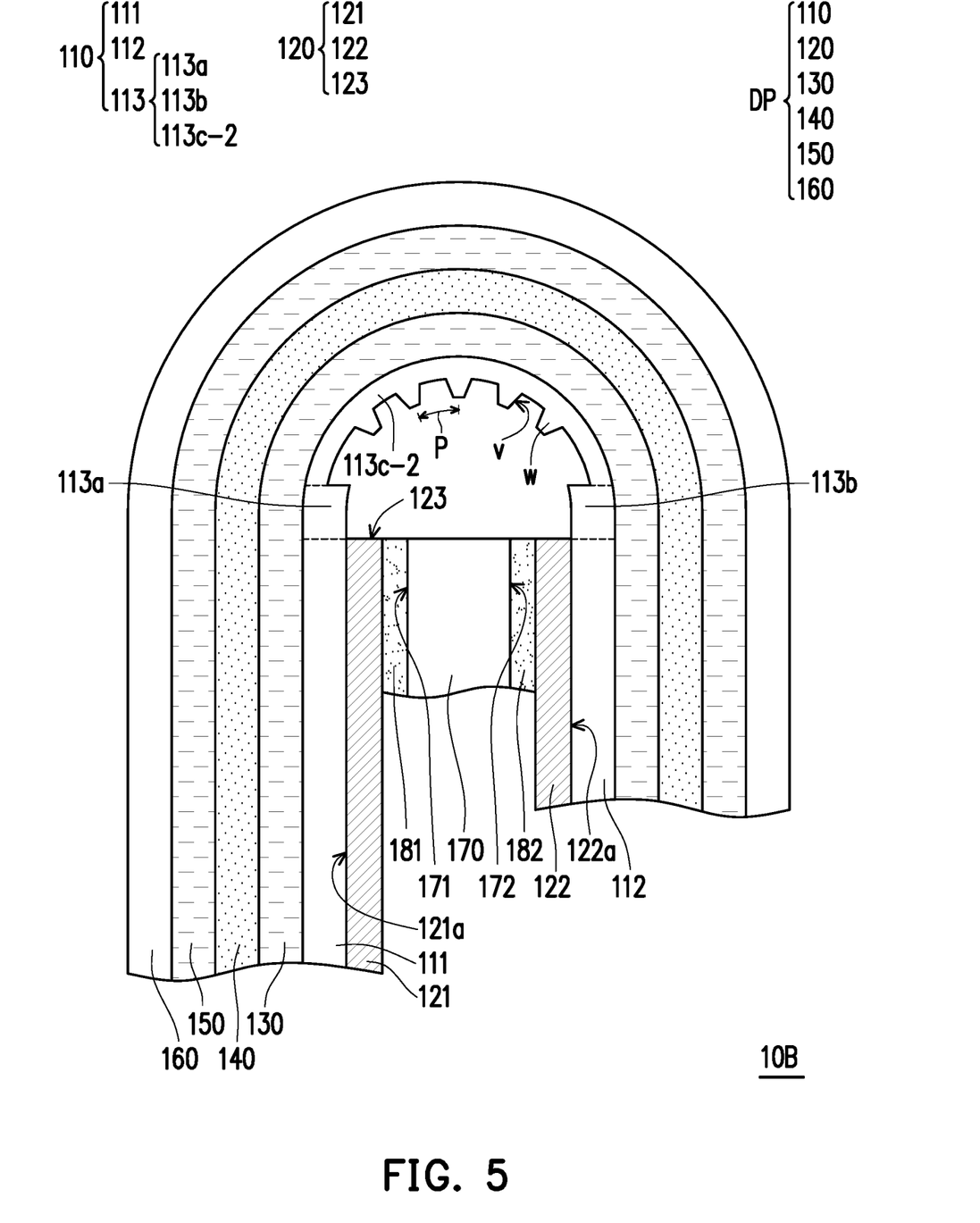
FIG. 5 is a cross-sectional schematic diagram of a display apparatus 10B according to a further embodiment of the present disclosure.

FIG. 5 is a cross-sectional schematic diagram of a display apparatus 10B according to a further embodiment of the present disclosure. The display apparatus 10B of FIG. 5 is similar to the display apparatus 10 of FIG. 1, but a manufacture sub-portion 113c-2 of FIG. 5 is slightly different from the manufacture sub-portion 113c of FIG. 1.

Referring to FIG. 5, specifically, in the present embodiment, the manufacture sub-portion 113c-2 is also a recess. The difference from the embodiment of FIG. 1 is that the manufacture sub-portion 113c-2 is formed by removing a large piece of the first substrate 110. In the embodiment of FIG. 5, the manufacture sub-portion 113c-2 is formed by removing a plurality of small pieces of the first substrate 110. In the embodiment of FIG. 5, the manufacture sub-portion 113c-2 may include a plurality of recesses v and convex blocks w arranged between the plurality of recesses. In the present embodiment, the convex blocks w are arranged at a pitch P. When the bending degree of the flexible display panel DP is larger, the pitch P is smaller.

Figure 6:
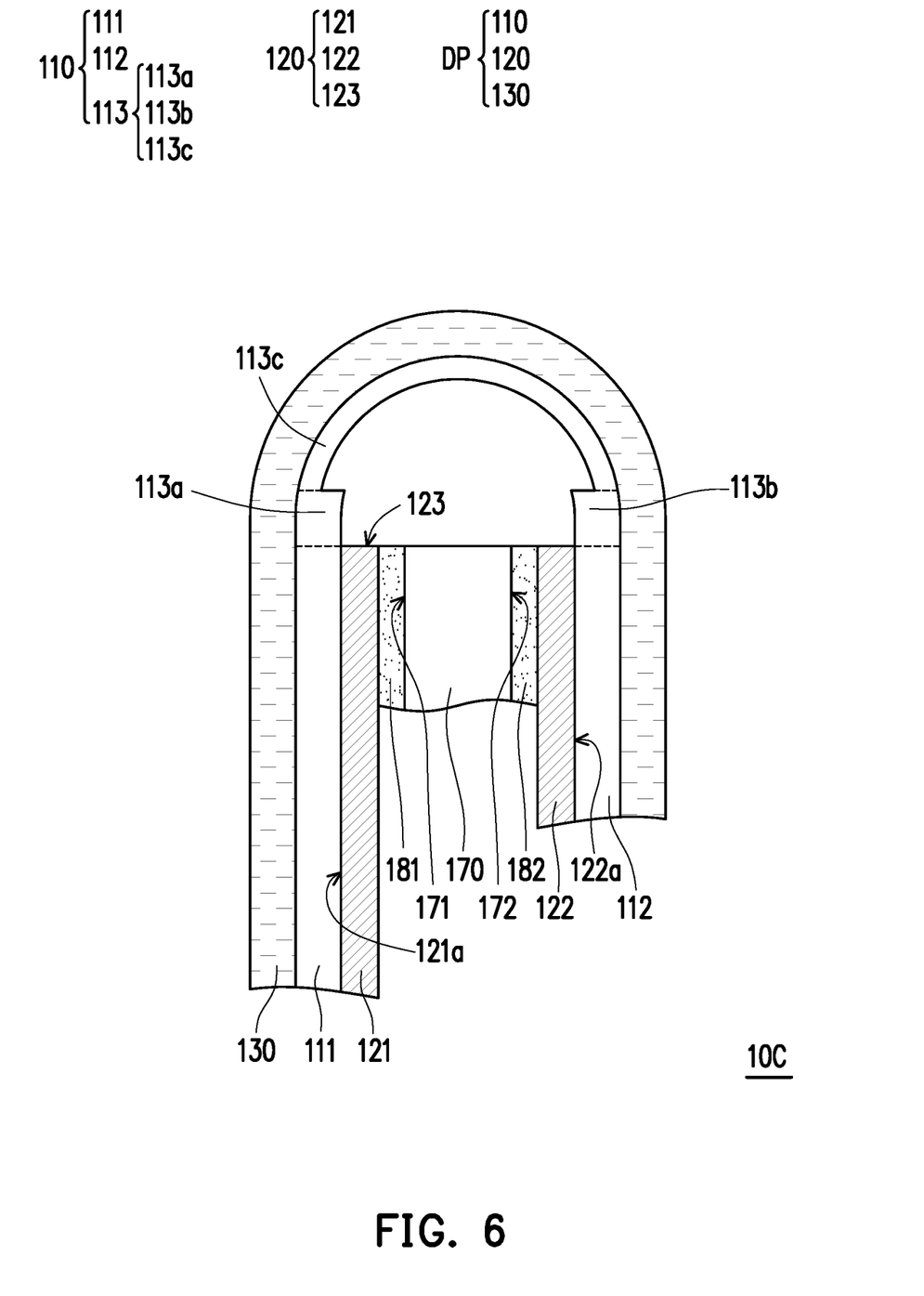
FIG. 6 is a cross-sectional schematic diagram of a display apparatus 10C according to a further more embodiment of the present disclosure.

FIG. 6 is a cross-sectional schematic diagram of a display apparatus 10C according to a further more embodiment of the present disclosure. The display apparatus 10C of FIG. 6 is similar to the display apparatus 10 of FIG. 1, but the display apparatus 10C of FIG. 6 may not include the middle layer 140, the second element layer 150 and the second substrate 160.

Figure 7:
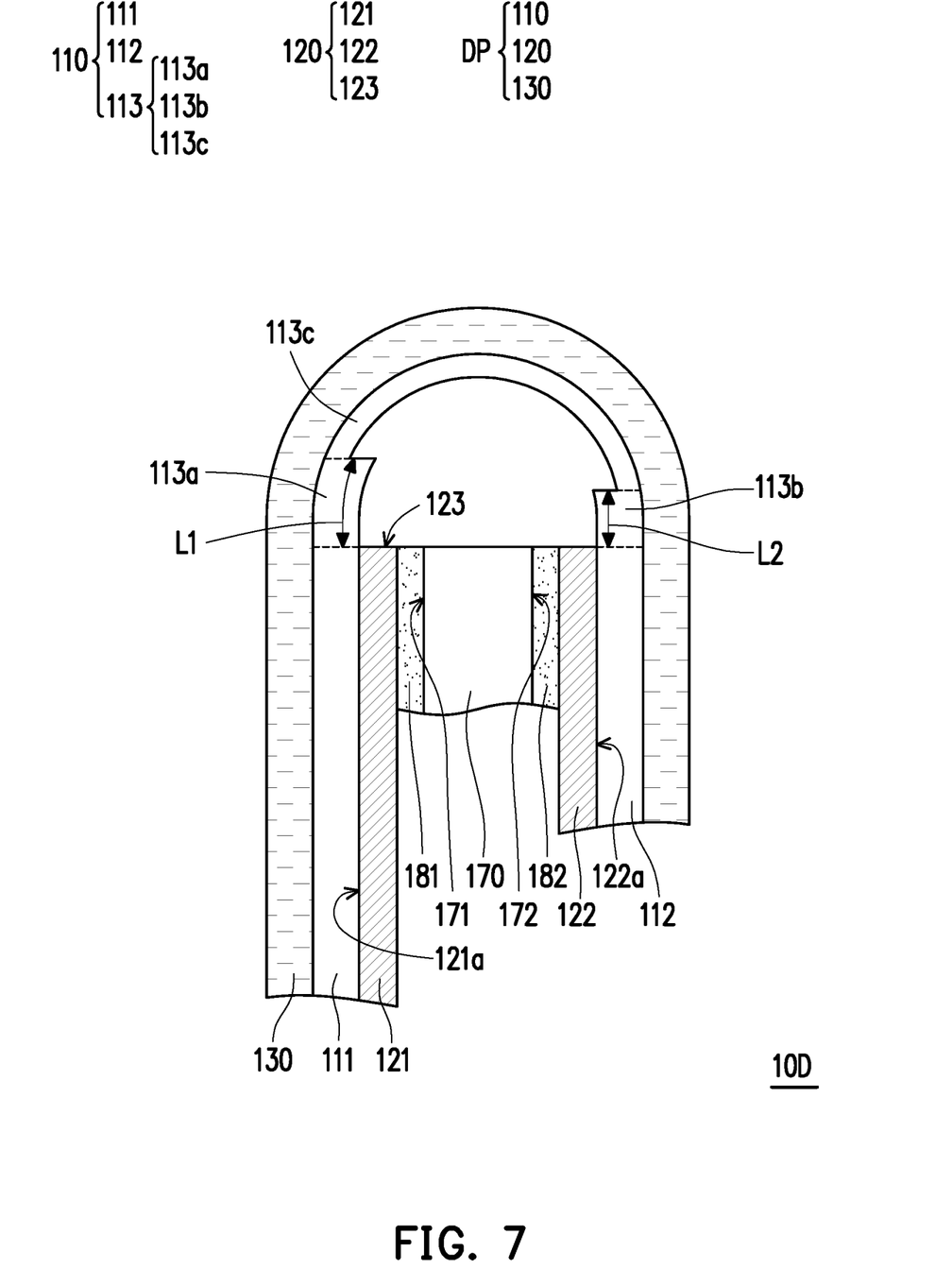
FIG. 7 is a cross-sectional schematic diagram of a display apparatus 10D according to a further more embodiment of the present disclosure.

FIG. 7 is a cross-sectional schematic diagram of a display apparatus 10D according to a further more embodiment of the present disclosure. The display apparatus 10D of FIG. 7 is similar to the display apparatus 10C of FIG. 6, and a difference therebetween is that: in the embodiment of FIG.

7, the width L1 of the first mesa sub-portion 113a is not equal to the width L2 of the second mesa sub-portion 113b. For example, in the present embodiment, the width L1 of the first mesa sub-portion 113a is greater than the width L2 of the second mesa sub-portion 113b. The width L1 is, for example, 400 µm, and the width L2 is, for example, 250 µm. However, the present disclosure is not limited thereto. In another embodiment, the width L1 of the first mesa sub-portion 113a may also be less than the width L2 of the second mesa sub-portion 113b. The width L1 is, for example, 250 µm, and the width L2 is, for example, 400 µm, but the width L1 and the width L2 have different degrees of influence on the improvement of the resilience force.

Figure 8:
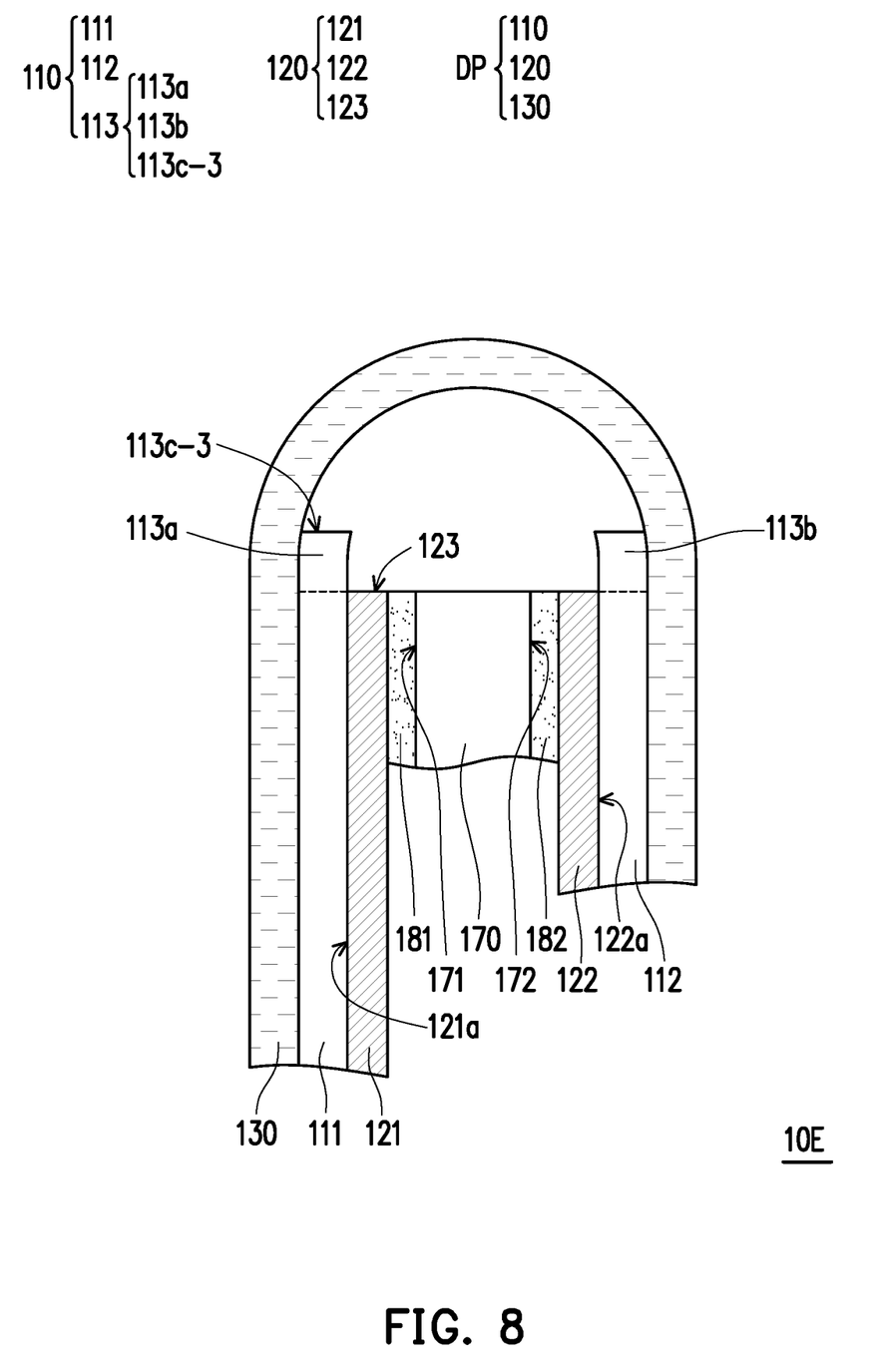
FIG. 8 is a cross-sectional schematic diagram of a display apparatus 10E according to one embodiment of the present disclosure.

FIG. 8 is a cross-sectional schematic diagram of a display apparatus 10E according to one embodiment of the present disclosure. The display apparatus 10E of FIG. 8 is similar to the display apparatus 10C of FIG. 6, and a difference therebetween is that: in the embodiment of FIG. 8, a manufacture sub-portion 113c-3 may be a through hole of the third portion 113 of the first substrate 110.

In addition, it should be noted that in the aforementioned embodiment, the first mesa sub-portion 113a has a consistent thickness, and the second mesa sub-portion 113b has a consistent thickness. However, the present disclosure is not limited thereto. The first mesa sub-portion 113a may also have an inconsistent thickness, and/or the second mesa sub-portion 113b may also have an inconsistent thickness. For example, the thickness of the first mesa sub-portion 113a may be also gradually changed, and the thickness of the second mesa sub-portion 113b may be also gradually changed.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A display apparatus, comprising:
   a substrate, comprising a first portion, a second portion and a third portion;
   an element layer, arranged on a first side of the substrate;
   a protective film, arranged on a second side of the substrate, and having a first portion, a second portion and an opening, wherein the opening of the protective film is located between the first portion of the protective film and the second portion of the protective film, and the first portion of the protective film, the second portion of the protective film and the opening of the protective film are respectively overlapped with the first portion of the substrate, the second portion of the substrate and the third portion of the substrate;
   a mechanical member, arranged on the second side of the substrate, and having a first surface and a second surface opposite to each other;
   a first adhesive layer, arranged on the first surface of the mechanical member; and
   a second adhesive layer, arranged on the second surface of the mechanical member, wherein the first portion of the protective film is arranged on the first adhesive layer; the second portion of the protective film is arranged on the second adhesive layer; and the third portion of the substrate is connected between the first portion of the substrate and the second portion of the substrate and is bent;
   the third portion of the substrate having a first mesa sub-portion and a manufacture sub-portion; the first mesa sub-portion extends from the first portion of the substrate to the outside of the first adhesive layer; and the manufacture sub-portion is a recess recessed towards the element layer or a through hole of the third portion of the substrate.

2. The display apparatus according to claim 1, wherein the third portion of the substrate further comprises a second mesa sub-portion; the manufacture sub-portion is arranged between the first mesa sub-portion and the second mesa sub-portion; and the second mesa sub-portion extends from the second portion of the substrate to the outside of the second adhesive layer.

3. The display apparatus according to claim 2, wherein a first portion of the substrate, a second portion of the substrate and a third portion of the substrate are arranged in a direction; the opening of the protective film has a width H in the direction; the first portion of the protective film has a surface facing the element layer, and the second portion of the protective film has a surface facing the element layer; and the surface of the first portion of the protective film is spaced apart from the surface of the second portion of the protective film by a distance 2r, and H≥πr.

4. The display apparatus according to claim 2, wherein a first portion of the substrate, a second portion of the substrate and a third portion of the substrate are arranged in a direction; the opening of the protective film has a width H in the direction; the first portion of the protective film has a surface facing the element layer, and the second portion of the protective film has a surface facing the element layer; the surface of the first portion of the protective film is spaced apart from the surface of the second portion of the protective film by a distance 2r; the first mesa sub-portion has a width L1 in the direction; the second mesa sub-portion has a width L2 in the direction; and the manufacture sub-portion has a width M in the direction, M=H−(L1+L2), and $$\frac{\pi r}{4} \leq M \leq \frac{9\pi r}{10}.$$

5. The display apparatus according to claim 2, wherein a first portion of the substrate, a second portion of the substrate and a third portion of the substrate are arranged in a direction; the opening of the protective film has a width H in the direction; the first portion of the protective film has a surface facing the element layer, and the second portion of the protective film has a surface facing the element layer; the surface of the first portion of the protective film is spaced apart from the surface of the second portion of the protective film by a distance 2r; the first mesa sub-portion has a width L1 in the direction; the second mesa sub-portion has a width L2 in the direction; and the manufacture sub-portion has a width M in the direction, M=H−(L1+L2), and $$\frac{\pi r}{3} \leq M \leq \frac{2\pi r}{3}.$$

6. The display apparatus according to claim 2, wherein a first portion of the substrate, a second portion of the substrate and a third portion of the substrate are arranged in a direction; the first mesa sub-portion has a width L1 in the direction; the second mesa sub-portion has a width L2 in the direction; and the width L1 is substantially equal to the width L2.

7. The display apparatus according to claim 2, wherein a first portion of the substrate, a second portion of the substrate and a third portion of the substrate are arranged in a direction; the first mesa sub-portion has a width L1 in the direction; the second mesa sub-portion has a width L2 in the direction; and the width L1 is not equal to the width L2.

8. The display apparatus according to claim 1, wherein the first portion of the substrate has a thickness T1, the manufacture sub-portion of the substrate has a depth h, and $0 < h \leq T1$.

9. The display apparatus according to claim 1, wherein the first portion of the substrate has a thickness T1, and the manufacture sub-portion of the substrate has a depth h, and $$50\% \leq \frac{h}{T1} \leq 90\%.$$

10. The display apparatus according to claim 1, wherein the manufacture sub-portion is the recess, and a bottom surface of the recess is a fluctuant surface.

* * * * *